United States Patent [19]

Rogers

[11] Patent Number: 5,289,040
[45] Date of Patent: Feb. 22, 1994

[54] COMPENSATING LEAD STRUCTURE FOR DISTRIBUTED IC COMPONENTS

[75] Inventor: Alan C. Rogers, Palo Alto, Calif.

[73] Assignee: National Semiconductor Corporation, Santa Clara, Calif.

[21] Appl. No.: 743,697

[22] Filed: Aug. 12, 1991

[51] Int. Cl.$^5$ .................. H01L 23/48; H01L 27/02
[52] U.S. Cl. .................. 257/666; 257/369; 257/401; 257/775; 257/919
[58] Field of Search .................. 357/70, 40, 65, 68, 357/51, 23.1, 41, 42; 257/919, 666, 368, 369, 536, 773, 775, 401

[56] References Cited

U.S. PATENT DOCUMENTS

| 4,583,111 | 4/1986 | Early | 357/68 |
| 4,961,010 | 10/1990 | Davis | 307/443 |
| 5,044,750 | 9/1991 | Shamble | 356/372 |
| 5,175,604 | 12/1992 | Nogami | 257/919 |

*Primary Examiner*—Mark V. Prenty
*Attorney, Agent, or Firm*—Daniel H. Kane; Richard C. Calderwood; Stephen R. Robinson

[57] ABSTRACT

An integrated circuit constructed using exposure and etching steps in an FET fabrication process incorporates electrical lead structures coupled to distributed IC components to compensate for process variation. The electrical lead structure (10,14,16,24,34 is composed of an etchable conductive layer constructed in a configuration with graduated coupling widths (B,C,D,E ...) forming a graduated range of respective etchable dimensions arranged in an electrically coupled sequence. A primary lead (IA) is coupled at a first end to the widest coupling width (B). A plurality of secondary leads (0B,0C,0D,0E ...) distributed along the electrically coupled sequence of graduated coupling widths are coupled respectively to the distributed electrical component elements (P1B,P1C,P1D,P1E ...) (N1B,N1C,N1D,N1E ...) (RB,RC,RD,RE ...) of a distributed electrical component such as a PMOS transistor (P1) NMOS transistor (N1) or resistor (R). The graduated coupling widths (B,C,D,E ...) of the electrical lead structure (10,14,16,24,34) electrically couple the secondary leads (0B,0C,0D,0E ...) to the primary lead (IA) through incremental portions of the electrically coupled sequence of graduated coupling widths. The electrical lead structure compensates for variation in exposure and etching steps by varying the number of distributed electrical component elements in the distributed circuit. In a distributed CMOS transistor structure (12) first and second source lead structures (14,16) are oriented to compensate for process variation in length (L) of etchable conductive layer gate segments (G) by varying the number of distributed complementary PMOS and NMOS transistor elements.

22 Claims, 3 Drawing Sheets

COMPENSATING LEAD STRUCTURE FOR DISTRIBUTED IC COMPONENTS

TECHNICAL FIELD

This invention relates to a new integrated circuit (IC) fabrication method and structure which compensate for uncontrolled process variation in exposure and etching steps during fabrication. In the new integrated circuit one or more etchable conductive lead structures are coupled to distributed IC components. The lead structures maintain substantially constant operating characteristics for the distributed IC components despite process variation in component parameters. In the case of MOSFET IC's, for example, the new electrical lead structure provides automatic compensation for uncontrolled variation in the length dimension of polysilicon gates during fabrication of MOS field effect transistors (FET's) including PMOS, NMOS and CMOS transistors.

BACKGROUND ART

The voltage applied to the conductive polysilicon or "poly" layer gate of field effect transistors (FET's) controls the primary current flow between the spaced apart source and drain semiconductor silicon regions. In PMOS transistor elements P type silicon source and drain regions are formed in an N type silicon substrate or well. In NMOS transistor elements N type source and drain regions are formed in a P well. The source and drain regions are therefore separated by a channel of opposite conductivity semiconductor material. An insulating layer is then formed over the surface. For each MOS transistor element the conductive poly layer gate is formed over the insulating layer, overlies the channel, and overlaps the source and drain regions.

The dimensions of the polysilicon layer gate are important factors in determining the channel resistance between the source and drain regions of an MOS transistor element and therefore the transistor current carrying capacity or drive. The poly layer gate dimension in the source/drain current flow direction is referred to as the gate length formed over a corresponding channel length. For a constant gate width and channel width, the channel resistance is higher and transistor element drive is lower for a longer gate length and longer channel length between the source and drain regions. Conversely the channel resistance is lower and transistor element drive higher for a shorter gate length and shorter channel length between the source and drain regions.

In the fabrication of the MOS IC transistor elements there is considerable process variation in the poly gate length. This dimension of the poly gate is largely determined by exposure and etching steps. There is typically accompanying variation in the exposure step and in the etching rate of the gate forming polysilicon layer. As a result the operating characteristics of the MOS transistor elements may substantially vary across a wafer, from wafer to wafer, from lot to lot, and across a reticle.

Prior art structures devised for monitoring this process variation are known as "Murray Daggers." Polysilicon Murray Daggers are apparently distributed across the wafer for visually indicating the greater or lesser extent of the poly etch. A simple polysilicon Murray Dagger structure 10 is shown in FIG. 1. The poly etching occurs on all sides of the structure and the cumulative etching at a particular location on a wafer is reflected by the number of stepped or graduated coupling widths B,C,D,E . . . entirely etched away on the right of the "dagger" lead structure, or conversely, the number remaining. The prior use of this Murray Dagger structure 10 is limited to use as a monitor only for visual inspection or electrical indication of process variation using the primary lead IA and secondary leads 0B,0C,0D,0E . . . .

The Murray Dagger structure 10 of FIG. 1 may be characterized more generally as being constructed in a configuration with graduated coupling widths B,C,D,E . . . forming a graduated range of respective etchable dimensions arranged in an electrically coupled sequence from a widest coupling width B to a narrowest coupling width E.. which in this case is the coupling width H. A primary lead IA is electrically coupled at one end of the lead structure 10 adjacent to the widest coupling width B. A plurality of secondary leads 0B,0C,0D,0E . . . is distributed along the electrically coupled sequence of graduated coupling widths The graduated coupling widths B,C,D,E . . . of the lead structure 10 electrically couple the secondary leads 0B,0C,0D,0E . . . to the primary lead IA through respective incremental portions of the electrically coupled sequence of graduated coupling widths B,C,D,E . . . . As noted above the prior art use of this structure is limited to visual inspection or electrical indication of IC fabrication process variation in exposure and etching steps according to the electrical continuity detected between the primary lead IA and any remaining secondary leads 0B,0C,0D,0E . . . .

The only U.S. patent reference of interest of which applicant is aware is U.S. Pat. No. 4,583,111 assigned by James M. Early to Fairchild Semiconductor Corporation. Of interest to the examination of this patent application is the circuit configuration in FIG. 9. The ground and power busses are in elongate stepped configurations.

Each bus services multiple logic gates and the width of the step of each step segment of the elongate stepped bus configuration is proportional to the current carried at that location of the bus. The current density in each bus is therefore maintained at a constant level with uniform voltage gradient. The ground and power busses are placed side by side and oppositely oriented in the stepped directions so that the widths are complementary to each other and "nested." The effective constant width of the pair of nested busses is substantially less than two conventional busses.

The elongate stepped configuration bus structures of James Early, however, are not intended for process monitoring or process control. They are not structures for reflecting differential or variable etching. They are constant configuration metal layers intended to maintain constant current density and reduce geometry. They are not intended to be subject to the selective and sometimes uncontrolled process etching of polysilicon for compensation purposes as in the present invention.

OBJECTS OF THE INVENTION

It is an object of the present invention to incorporate Murray Dagger type process monitor structures as integral electrical circuit components of integrated circuits in such a way as to provide automatic compensation in the integrated circuit operating characteristics for IC fabrication process variation in exposure and etching steps. Thus the invention seeks to go beyond Murray Dagger type monitoring structures to integrated compensating electrical lead structures which compensate for parameter variation in IC components caused by process variation during fabrication steps.

Another object of the invention is to incorporate in MOS and CMOS integrated circuits having polysilicon gates, etchable electrical lead structures which compensate for uncontrolled variation in the length dimension of polysilicon gates during fabrication of MOS and CMOS transistors. Thus, according to the invention the Murray Dagger structures are incorporated as leads in distributed transistor and resistor elements in a manner to cause variations in the operating characteristics of the transistor elements inversely and proportionally opposite to the variations in operating characteristics caused by uncontrolled process variation in gate lengths.

A further object of the invention is to provide novel integrated circuit fabrication methods and structures which maintain substantially constant transistor element operating characteristics despite IC fabrication process variations in exposure and etching steps which cause variation in transistor parameters.

DISCLOSURE OF THE INVENTION

In order to accomplish these results, the invention provides a compensating structure for an IC device having an IC electrical component subject to a first variation in an electrical operating parameter caused by uncontrolled process variation in exposure and etching steps during fabrication of the IC device. According to the invention, an etchable electrical lead structure is coupled to the IC electrical component. The etchable electrical lead structure is constructed to cause a second variation in the electrical operating parameter of the IC electrical component in response to the uncontrolled process variation. The second variation is in a parametric value direction opposite to the first variation for process compensation.

The invention provides an electrical lead structure coupled to a distributed electrical component having distributed electrical component elements coupled in a distributed circuit. According to the invention the electrical lead structure comprises an etchable conductive layer constructed in a configuration with graduated coupling widths. The graduated coupling widths form a graduated range of respective etchable dimensions arranged in an electrical sequence from a widest coupling width to a narrowest coupling width.

A primary lead is electrically coupled at a first end of the sequence of graduated coupling widths adjacent to the widest coupling width. A plurality of secondary leads is distributed along the electrically coupled sequence of graduated coupling widths. The secondary leads are coupled respectively to the distributed electrical component elements of the distributed electrical component.

According to the invention the graduated coupling widths of the lead structure electrically couple the secondary leads to the primary lead through respective incremental portions of the electrical sequence of graduated coupling widths. The electrical lead structure is oriented to compensate for IC fabrication process variation in exposure and etching steps by varying the number of distributed electrical component elements electrically coupled into the distributed circuit.

In the preferred example embodiment, the electrical lead structure is constructed as a step configuration structure where the graduated coupling widths are a sequence of steps of graduated widths. According to an alternative embodiment the electrical lead structure comprises a plurality of similar geometric structures in an overlapping sequence with graduated overlapping portions. The graduated overlapping portions of the sequence comprise the graduated coupling widths. Preferably the similar geometric structures are in the configuration of diamonds, rectangles or squares in a graduated overlapping sequence with the corners overlapping.

In a further example embodiment of the invention, the distributed electrical component may be a distributed input resistor having distributed electrical resistance elements. The distributed input resistor is typically coupled to the control gate node of an MOS output transistor element.

The distributed electrical component may itself be a distributed MOS transistor composed of distributed MOS transistor elements, either NMOS or PMOS. In this example the electrical lead structure is a source lead structure having secondary leads coupled to the respective source regions of the distributed MOS transistor elements and a primary source lead coupled to a power rail. The invention is also applied in CMOS transistor circuits having distributed CMOS transistor elements etc.

According to the broad method of compensating for uncontrolled process variation, the invention contemplates steps of coupling an etchable electrical lead structure to the IC electrical component and constructing the electrical lead structure to cause a second variation in an electrical operating parameter of the IC electrical component in response to uncontrolled process variation in exposure and etching steps. The method steps cause the second variation to occur in a parametric value direction opposite to a first variation for process compensation and for stabilizing the electrical operating parameter of the IC electrical component.

BRIEF DESCRIPTION OF THE DRAWINGS

FIG. 2 is a schematic circuit diagram of a distributed CMOS transistor element with integral compensating source lead structures according to the invention while

DESCRIPTION OF PREFERRED EXAMPLE EMBODIMENTS AND BEST MODE OF THE INVENTION

Figure 1:
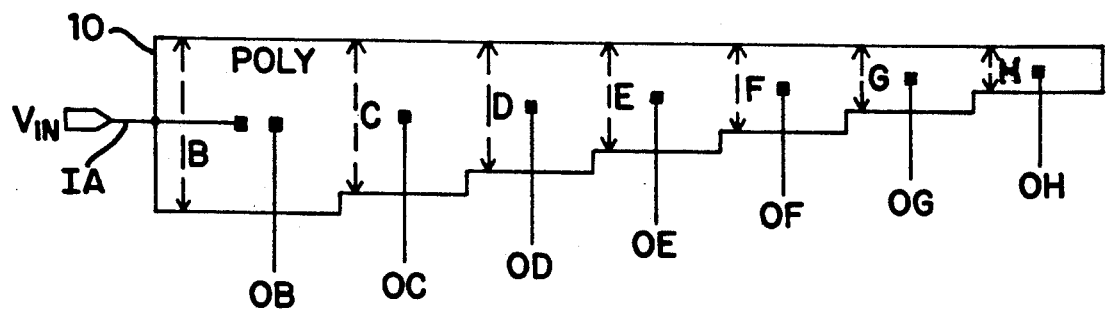
FIG. 1 is a diagrammatic plan view of a Murray Dagger type lead structure to be incorporated as an integral compensating structure into integrated circuits according to the invention.
Figure 2:
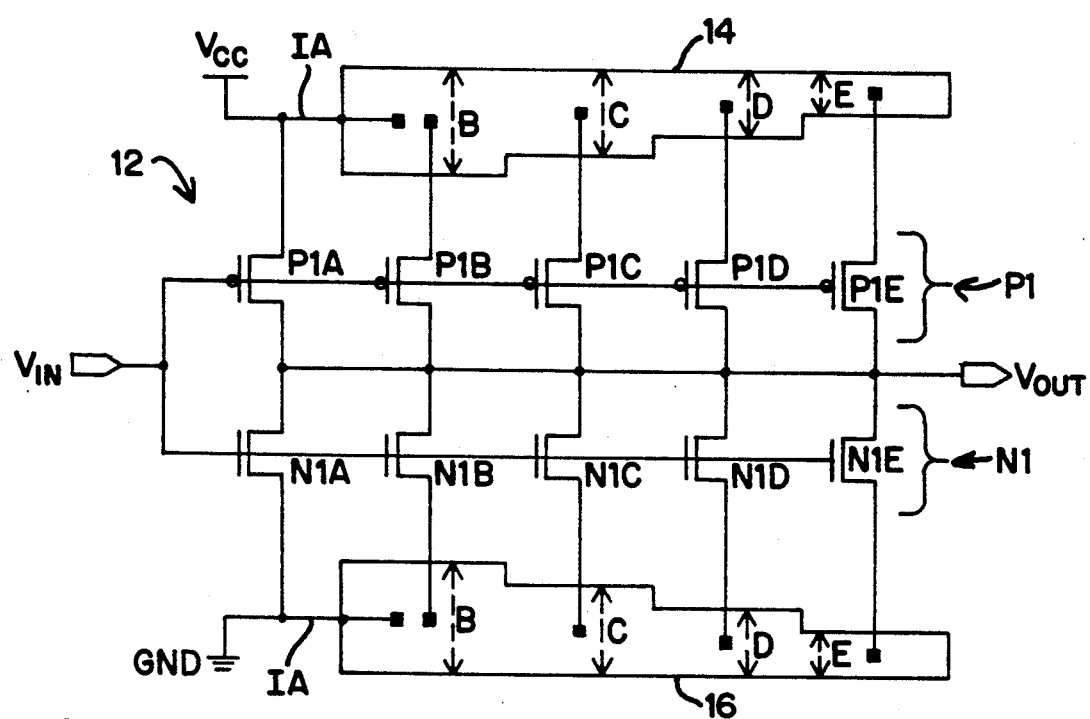
Figure 2A:
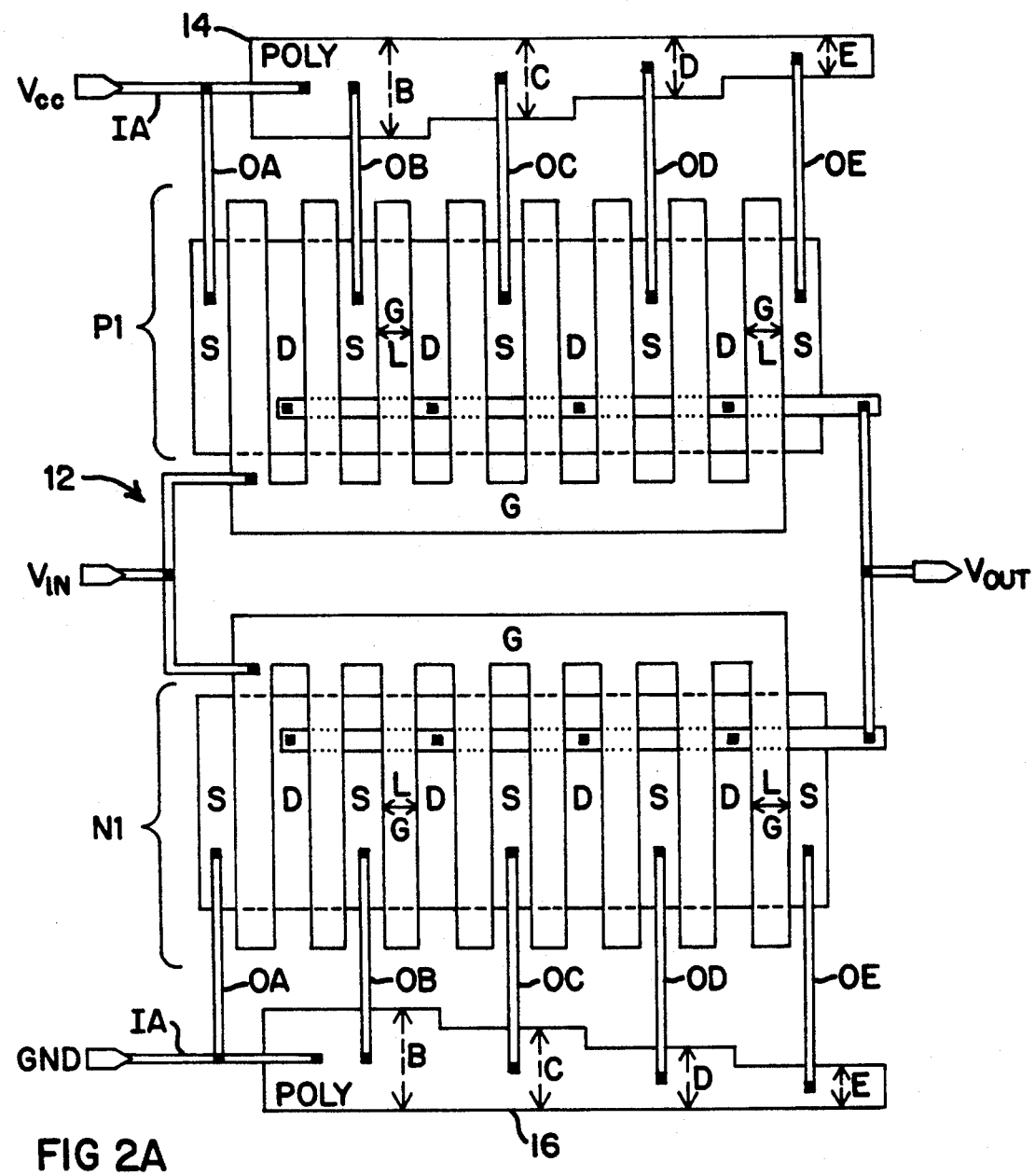
FIG. 2A is a diagrammatic plan view of mask overlays for layout and fabrication of the compensated distributed CMOS transistor structure of FIG. 2. It is noted that FIG. 2 is not drawn to scale as generally the width of the Murray Dagger structures is less than the width of the transistors.

The application of the invention to a distributed CMOS transistor input circuit composed of a pair of distributed MOS transistors P1, N1 is shown in FIGS. 2 and 2A. In this example distributed pairs of complementary PMOS transistor elements P1A,P1B,P1C,P1D,P1E and NMOS transistor elements N1A,N1B,N1C,N1D,N1E provide the distributed input CMOS transistor 12. The gate lead segments G of the distributed PMOS and NMOS transistor elements are coupled together to provide the input node $V_{IN}$ while the drain leads D of the distributed PMOS and NMOS transistor elements are coupled together to provide the output node $V_{OUT}$. The input node $V_{IN}$ receives logic high and low potential level input signals and the output node $V_{OUT}$ delivers inverted output signals with specified operating drive characteristics.

The source leads S of the distributed PMOS transistor elements P1A,P1B,P1C,P1D,P1E are coupled together to a high potential level supply power rail $V_{CC}$ through the secondary leads 0B,0C,0D,0E and the primary lead IA of a Murray Dagger type polysilicon lead structure 14. The source leads S of the distributed NMOS transistor elements N1A,N1B,N1C,N1D,N1E are coupled together to a low potential level ground rail GND through the secondary leads 0B,0C,0D,0E and the primary lead IA of another Murray Dagger type polysilicon lead structure 16.

During the poly etch step of the fabrication process, an increased etching rate variation may cause shorter poly gate lengths. The poly gate lengths are indicated by the double ended arrows L in FIG. 2A. With shorter poly gate lengths L, the respective distributed transistor elements have lower channel resistance and greater drive. The cumulative drive of the distributed input CMOS transistor may therefore otherwise be increased beyond the desired specification. However at the same time narrower segments of the graduated coupling widths A,B,C,D,E . . . at the right hand end of the Murray Dagger structures 14,16 may be entirely deleted by the increased cumulative poly etch. As a result a corresponding offsetting number of distributed NMOS transistor elements N1A,N1B,N1C,N1D,N1E and complementary PMOS transistor elements P1A,P1B,P1C,P1D,P1E are deleted from the overall input distributed CMOS transistor input circuit 12. The cumulative operating current carry capacity and drive characteristics of the distributed CMOS transistor are therefore reduced back to the desired operating specification range.

According to the example of FIGS. 2 and 2A, the dimensions of the Murray Dagger type poly structure leads and the gate forming poly layer are adjusted for proportionately inverse and compensating effects so that the desired operating characteristics of the distributed CMOS transistor input circuit are maintained over a range of process variations. The inverse compensating effects caused by incorporation of Murray Dagger type structures directly into the source leads of distributed transistor elements and as integral component structures of the operative integrated circuits render the distributed circuits substantially immune to process variations in poly gate lengths or at least substantially reduce the variation in operating characteristics caused by process variations.

It is noted with respect to MOS poly gate dimensions, that variations in poly gate width have the opposite effect from variations in poly gate length. That is, an increase in poly gate width and channel width reduces channel resistance and increases transistor drive and current carrying capacity. A reduction in poly gate width and channel width increases channel resistance and reduces transistor drive and current carrying capacity. Murray Dagger type structures are incorporated into the distributed CMOS transistor to cause an effective variation in poly gate width and channel width which offsets in opposite proportion the effects of process variations in poly gate length. As poly gate lengths decrease as a result of unwanted and uncontrolled process variation in the poly etch, the Murray Dagger source lead structures cause an effective reduction in the cumulative distributed poly gate width and channel width. These variations have inverse offsetting and self compensating effects on the operating characteristics of the CMOS transistor. These variations are set to maintain transistor operating characteristics within a desired stable specification operating range despite process variation.

To summarize, in the preferred example the integrated circuit distributed electrical component is a CMOS input transistor structure 12 having a distributed PMOS transistor P1 of a plurality of PMOS transistor elements coupled in parallel and a complementary distributed NMOS transistor N1 of a plurality of NMOS transistor elements coupled in parallel. First and second source lead structures 14,16 are provided from an etchable conductive layer constructed in a configuration with graduated coupling widths B,C,D,E . . . forming a graduated range of respective etchable dimensions arranged in an electrically coupled sequence. The first source lead structure 12 has a primary lead IA coupled to the high potential power rail $V_{CC}$ and a plurality of secondary leads 0B,0C,0D,0E . . . coupled respectively to source regions S of the PMOS transistor elements P1B,P1C,P1D,P1E . . . . The second source lead structure 16 has a primary lead IA coupled to the low potential power rail GND and a plurality of secondary leads 0B,0C,0D,0E . . . coupled respectively to the source regions S of the distributed NMOS transistor elements N1B,N1C,N1D,N1E . . . . The first and second source lead structures are oriented to compensate for IC fabrication process variation in length L of the etchable conductive layer gate segments G by varying the number of distributed NMOS and PMOS transistor elements coupled in the distributed circuit of the CMOS transistor structure 12.

Figure 3:
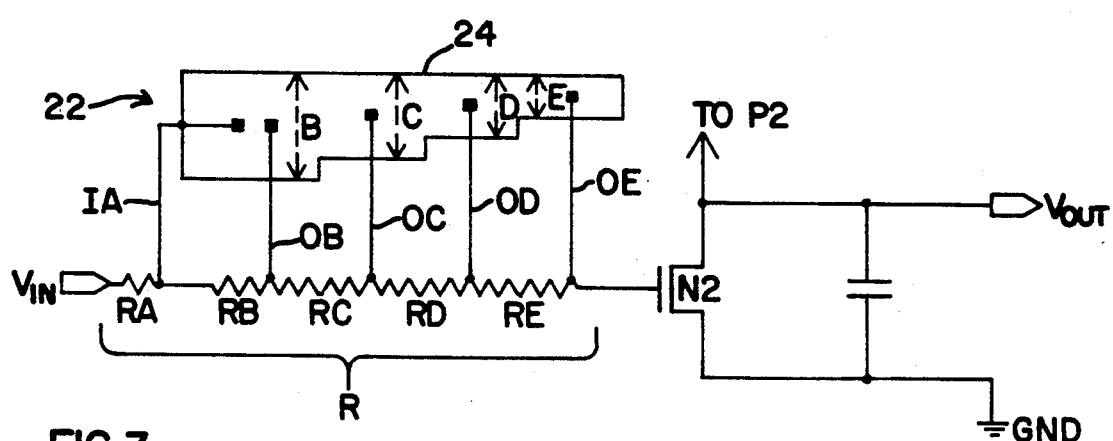
FIG. 3 is a schematic circuit diagram of an MOS output transistor with a compensating variable resistance control gate lead structure according to the invention.

In FIG. 3 the Murray Dagger type poly structure 24 is incorporated as a part of the gate lead circuit 22 of an output NMOS transistor element N2. The electrical lead structure 24 is incorporated in parallel with a distributed resistor R effectively providing a variable resistance gate lead. The variable resistance gate lead circuit 22 has a resistance that varies with process variation in the poly exposure and etch steps. Furthermore the resistance of the variable resistance gate lead varies inversely with channel resistance in the output NMOS transistor element N2 also caused by process variation.

Considering FIG. 3 in further detail, an uncontrolled or unwanted increase in the cumulative polysilicon etching would otherwise cause shorter poly gate length, lower channel resistance, and higher speed operation of the output NMOS transistor element N2. The over etch however deletes selected incremental coupling widths B,C,D,E of the step configuration poly lead structure 24 on the right hand side of the structure. The deletions increase the cumulative resistance of the variable resistance gate lead 22 by adding selected distributed resistor elements RB,RC,RD,RE of the distributed resistor R. The additional input resistance at the control gate node G delays the switching of the output NMOS transistor element N2. This inverse or compensating resistance effect maintains the rate of current switching within the desired range of operating specifications. Effectively, the added compensating gate lead resistance elements RB,RC,RD,RE and the output transistor element channel/gate length resistance vary inversely as do their respective associated time constants.

In the foregoing examples, the electrical lead structures are used to compensate for process variation in the etching of polysilicon elements and are also composed of polysilicon. The electrical lead structures may of course also be composed of other etchable electrically conductive materials used in IC fabrication. Materials may be selected for achieving the desired compensation for process variation in the exposure and etching steps.

Figure 4:
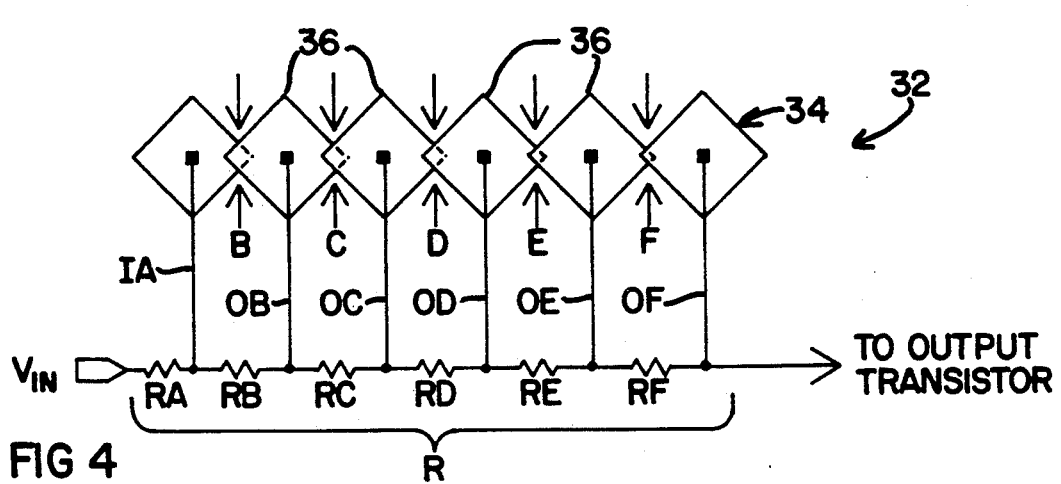
FIG. 4 is a schematic circuit diagram of an alternative compensating electrical lead structure for integral incorporation for example in the circuits of FIGS. 1-3.

An alternative configuration electrical lead structure 34 having graduated coupling widths B,C,D,E . . . is illustrated in FIG. 4. According to this embodiment, a plurality of similar geometric structures 36 are arranged in an overlapping sequence with graduated overlapping portions. The graduated overlapping portions of the sequence of overlapping similar geometrical structures 36 form the graduated coupling widths B,C,D,E . . . Preferably the similar geometric structures are diamonds, rectangles or squares in a graduated overlapping sequence with corners overlapping.

In the example of FIG. 4 the electrical lead structure 34 is coupled in parallel with a distributed resistor R having distributed resistor elements RA,RB,RC,RD,RE . . . coupled in series. The circuit of FIG. 4 provides, for example, a control gate circuit 32 similar to the control gate lead circuit 22 of FIG. 3. Thus the circuit of FIG. 4 may be coupled to an output transistor to perform the compensating circuit function of FIG. 3. Similarly, the electrical lead circuit 34 of graduated overlapping similar geometric structures 36 may be substituted for the stepped configuration electrical lead structures 14,16 of the circuit of FIGS. 2 and 2A. Further description of Murray Dagger type monitor structures in the configuration of the example of FIG. 4 is set forth in the Edward Shamble U.S. patent application Ser. No. 566,561 for A METHOD FOR CHECKING LITHOGRAPHY CRITICAL DIMENSIONS, filed Aug. 13, 1990, and now U.S. Pat. No. 5,044,750, issued Sep. 3, 1991 and assigned to the assignee of the present invention.

Figure 5:
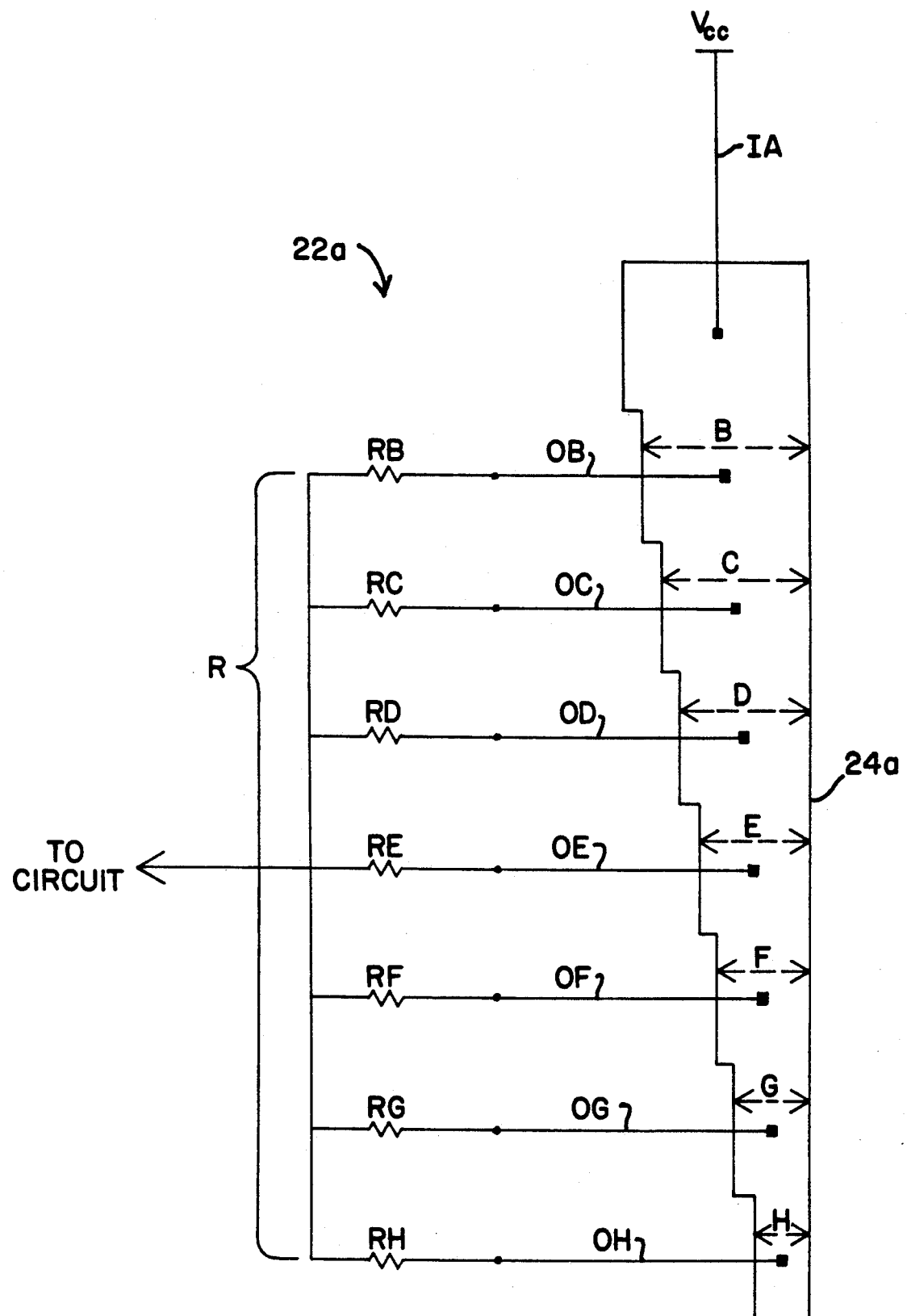
FIG. 5 is a schematic circuit diagram of an alternative coupling of the compensating lead structure coupled to a distributed resistor having distributed resistor elements coupled in parallel rather than in series.

A further example of an electrical lead structure 24a according to the invention coupled to a distributed resistor R is illustrated in FIG. 5. According to this example the distributed resistor R is composed of distributed resistor elements RB,RC,RD,RE . . . coupled in parallel. The secondary leads 0B,0C,0D,0E . . . of the electrical lead structure 24 are coupled to the parallel distributed resistor elements. Deletion of respective coupling widths B,C,D,E . . . as a result for example of over exposure or over etching, increases the composite resistance of distributed resistor R as shown by the parallel circuit equation for parallel resistors:

$$1/R = 1/RB + 1/RC + 1/RD + \ldots$$

Thus the electrical lead circuit of FIG. 5 produces resistance effects on MOS operating characteristics that are the opposite of the resistance effects caused by process variation in poly gate lengths of adjacent MOS transistors The circuit of FIG. 5 may also be applied for exampller, as a control gate node input circuit 22a similar to the input circuits 22,32 of FIGS. 3 and 4.

While the invention has been described with reference to MOS IC example embodiments, it is also applicable to junction FET IC's and to other IC families. In addition to the application of the invention to distributed IC components, the electrical lead structures may also be used to enable and disable entire subcircuits such as anti-noise circuits or to excise sections of circuits. Generally, the invention is intended to cover all modifications and equivalents within the scope of the following claims.

I claim:

1. A compensating structure for an integrated circuit (IC) device having a distributed IC electrical component of distributed electrical component elements, said distributed IC electrical component being subject to a first variation in an electrical operating parameter caused by uncontrolled process variation in exposure and etching steps during fabrication of the IC device comprising:

an electrical lead structure coupled to said IC electrical component, said electrical lead structure being constructed to cause a second variation in said electrical operating parameter of the IC electrical component in response to the uncontrolled process variation;

said electrical lead structure comprising an etchable conductive layer constructed in a configuration of graduated coupling widths forming a graduated range of respective etchable dimensions arranged in an electrically coupled sequence from a widest coupling width to a narrowest coupling width, and a plurality of secondary leads coupling said graduated coupling widths respectively to the distributed electrical component elements of the IC electrical component;

said electrical lead structure being constructed so that the second variation is in a parameter value direction opposite that of the first variation by varying the number of distributed electrical component elements in the distributed IC electrical component for process compensation.

2. An integrated circuit (IC) constructed using exposure and etching steps in an IC fabrication process, said IC having an electrical lead structure coupled to a distributed electrical component having distributed electrical component elements coupled in a distribute circuit, comprising:

said electrical lead structure comprising an etchable conductive layer constructed in a configuration with graduated coupling widths forming a graduated range of respective etchable dimensions arranged in an electrically coupled sequence from a widest coupling width to a narrowest coupling width;

said lead structure having a primary lead at a first end of the electrically coupled sequence of graduated coupling widths adjacent to the widest coupling width, and a plurality of secondary leads distributed along the electrically coupled sequence of graduated coupling widths and being coupled respectively to the distributed electrical component elements of the distributed electrical component;

said graduated coupling widths of the lead structure electrically coupling the secondary leads to the primary lead of the electrical lead structure through respective incremental portions of the electrically coupled sequence of graduated coupling widths of the electrical lead structure;

said electrical lead structure being oriented to compensate for IC fabrication process variation in exposure and etching steps by varying the number of distributed electrical component elements electrically coupled into the distributed circuit.

3. The integrated circuit of claim 2 wherein the electrical lead structure is constructed as a step configuration structure where the graduated coupling widths are a sequence of steps of graduated widths.

4. The integrated circuit of claim 2 wherein the electrical lead structure comprises a plurality of similar geometric structures in an overlapping sequence with graduated overlapping portions, said graduated overlapping portions of the sequence of overlapping similar geometrical structures comprising the graduated coupling widths.

5. The integrated circuit of claim 4 wherein the similar geometric structures of the electrical lead structure comprise diamonds, rectangles or squares in a graduated overlapping sequence with the corners overlapping.

6. The integrated circuit of claim 2 wherein the distributed electrical component comprises a distributed input resistor having distributed electrical resistance elements.

7. The integrated circuit of claim 6 wherein the distributed input resistor is coupled to the control gate node of an MOS input transistor element.

8. The integrated circuit of claim 2 wherein the distributed electrical component comprises a distributed MOS transistor composed of distributed MOS transistor elements coupled in parallel, said MOS transistor elements each having a source region, a drain region, and an etchable conductive layer gate segment;

and wherein the electrical lead structure comprises a source lead structure having secondary leads coupled to respective source regions of the distributed MOS transistor elements and a primary source lead coupled to a power rail.

9. The integrated circuit of claim 4 wherein the distributed electrical component comprises a CMOS transistor structure having a distributed PMOS transistor of a plurality of PMOS transistor elements coupled in parallel and a distributed NMOS transistor of a plurality of NMOS transistor elements coupled in parallel, said PMOS and NMOS transistor elements each having a source region, a drain region and an etchable conductive layer gate segment, said gate segments of the NMOS and PMOS transistor elements being coupled together to form an input of the CMOS transistor structure, said drain regions of the NMOS and PMOS transistor elements being coupled together to form an output of the CMOS transistor structure;

wherein the electrical lead structure comprises a first source lead structure having the plurality of secondary leads coupled respectively to source regions of the PMOS transistor elements and the primary lead coupled to a first power rail;

and further comprising a second source lead structure having the primary lead coupled to a second power rail and the plurality of secondary source leads coupled respectively to the source regions of the NMOS transistor elements;

said first and second source lead structures being oriented to compensate for process variation in length of the etchable conductive layer gate segments by varying the number of distributed PMOS and NMOS transistor elements coupled in the distributed circuit of the CMOS transistor structure.

10. The integrated circuit of claim 9 wherein the first and second source lead structures are constructed as step configuration structures, each having a sequence of steps of graduated widths comprising the graduated coupling widths.

11. A distributed CMOS transistor structure having a plurality of NMOS transistor elements coupled in parallel and a plurality of PMOS transistor elements coupled in parallel, said NMOS and PMOS transistor elements each having a source region, a drain region and an etchalbe conductive layer gate segment, said gate segments of the NMOS and PMOS transistor elements being coupled together to form an input of the CMOS transistor structure, said drain regions of the NMOS and PMOS transistor elements being coupled together to form an output of the CMOS transistor structure, the improvement comprising:

a first source lead structure comprising an etchable conductive layer constructed in a configuration with graduated coupling widths forming a graduated range of respective etchable dimensions arranged in an electrically coupled sequence;

said first source lead structure having a primary lead coupled to a first power rail and a plurality of secondary leads coupled respectively to source regions of the PMOS transistor elements, said graduated coupling widths of the first source lead structure coupling the secondary leads to the primary lead of the first source lead structure through respective incremental portions of the electrically coupled sequence of the graduated coupling widths;

and a second source lead structure having a primary lead coupled to a second power rail and a plurality of secondary leads coupled respectively to source regions of the NMOS transistor elements, said second source lead structure having graduated coupling widths coupling the secondary leads to the primary lead of the second source lead structure through respective incremental portions of the electrically coupled sequence of the graduated coupling widths;

said first and second source lead structures being oriented to compensate for IC fabrication process variation in length of the etchable conductive layer gate segments by varying the number of distributed NMOS and PMOS transistor elements coupled in the distributed circuit of the CMOS transistor structure.

12. The distributed CMOS transistor structure of claim 11 wherein the fist and second source lead structures are constructed as step configuration structure where the graduated coupling widths are sequences of steps of graduated widths.

13. The distributed CMOS transistor structure of claim 11 wherein the first and second source lead structures each comprise a plurality of similar geometric structures in an overlapping sequence with graduated overlapping portions, said graduated overlapping portions of the sequence of overlapping similar geometrical structures comprising the graduated coupling widths.

14. The distributed CMOS transistor structure of claim 13 wherein the similar geometric structures of the first and second source lead structure comprise diamonds, rectangles or squares in a graduated overlapping sequence with corners overlapping.

15. The distributed CMOS transistor structure of claim 11 wherein the first and second source lead structures comprise Murray Dagger structures.

16. An integrated circuit constructed using exposure and etching steps in an IC fabrication process, said IC having an electrical lead structure coupled to a distributed input resistor having distributed electrical resistor elements, said input resistor being coupled to the control gate node of an MOS input transistor, comprising:
said electrical lead structure comprising an etchable conductive layer constructed in a configuration with graduated coupling widths forming a graduated range of respective etchable dimensions arranged in an electrically coupled sequence from a widest coupling width to a narrowest coupling width;
said lead structure having a primary lead at a first end of the electrically coupled sequence of graduated coupling widths, and a plurality of secondary leads distributed along the electrically coupled sequence of graduated coupling widths and being coupled respectively to the distributed electrical resistor elements of the distributed input resistor;
said graduated coupling widths of the lead structure coupling the secondary leads to the primary lead of the electrical lead structure through respective incremental portions of the electrically coupled sequence of graduated coupling widths;
said electrical lead structure being oriented to compensate for IC fabrication process variation in exposure and etching steps by varying the number of distributed electrical resistor elements in the distributed input resistor.

17. The integrated circuit of claim 16 wherein the lead structure is constructed as step configuration structure where the graduated coupling widths are a sequence of steps of graduated widths.

18. The integrated circuit of claim 16 wherein the lead structure comprises a plurality of similar geometric structures in an overlapping sequence with graduated overlapping portions, said graduated overlapping portions of the sequence of overlapping similar geometrical structures comprising the graduated coupling widths.

19. The integrated circuit of claim 18 wherein the similar geometric structures of the electrical lead structure comprises diamond, rectangles or squares in a graduated overlapping sequence with corners overlapping.

20. The integrated circuit of claim 16 wherein the distributed resistor elements of the distributed input resistor are coupled in series.

21. The integrated circuit of claim 16 wherein the distributed resistor elements of the distributed input resistor are coupled in parallel.

22. A method of compensating for a first variation in an electrical operating parameter of an IC device caused by uncontrolled process variation in exposure and etching steps during fabrication of the IC device comprising:
coupling an etchable electrical lead structure to a distributed IC electrical component;
constructing the electrical lead structure form an etchable conductive layer in a configuration with graduated etchable coupling widths and coupling the respective graduated etchable coupling widths to respective distributed electrical component elements of the distributed IC electrical component;
conducting the electrical lead structure to cause a second variation in said electrical operating parameter of the IC device in response to said uncontrolled process variation by varying the number of distributed electrical component element sin the distributed IC electrical component;
and exposing and etching the electrical lead structure during fabrication of the IC device so that the second variation of the electrical operating parameter varies in a parameter value direction opposite the first variation for process compensation.

* * * * *